(12) United States Patent
Guo et al.

(10) Patent No.: US 11,874,102 B2
(45) Date of Patent: Jan. 16, 2024

(54) THICK PHOTO RESIST LAYER METROLOGY TARGET

(71) Applicant: KLA Corporation

(72) Inventors: Lingyi Guo, Shanghai (CN); Jincheng Pei, Shanghai (CN)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/996,699

(22) Filed: Aug. 18, 2020

(65) Prior Publication Data

US 2021/0199427 A1 Jul. 1, 2021

Related U.S. Application Data

(60) Provisional application No. 62/955,243, filed on Dec. 30, 2019.

(51) Int. Cl.
| | | |
|---|---|---|
| *G01B 11/27* | (2006.01) | |
| *G03F 1/70* | (2012.01) | |
| *G03F 1/36* | (2012.01) | |
| *G03F 7/00* | (2006.01) | |

(52) U.S. Cl.
CPC ............. *G01B 11/272* (2013.01); *G03F 1/36* (2013.01); *G03F 1/70* (2013.01); *G03F 7/70633* (2013.01)

(58) Field of Classification Search
CPC . G01B 11/272; G03F 1/36; G03F 1/70; G03F 7/70633; G03F 7/706; G03F 7/70625; G03F 7/70641; G03F 7/70683
USPC .... 356/399–401, 237.2–237.6; 382/144–146
See application file for complete search history.

(56) References Cited

U.S. PATENT DOCUMENTS

| | | | |
|---|---|---|---|
| 6,982,793 B1* | 1/2006 | Yang | G03F 7/70633 356/401 |
| 7,541,201 B2 | 6/2009 | Ghinovker | |
| 8,330,281 B2 | 12/2012 | Ghinovker et al. | |
| 9,214,317 B2 | 12/2015 | Shur | |
| 9,476,698 B2 | 10/2016 | Abdulhalim et al. | |
| 10,190,979 B2 | 1/2019 | Manassen et al. | |
| 10,527,951 B2 | 1/2020 | Yohanan et al. | |
| 2003/0223630 A1* | 12/2003 | Adel | G03F 9/7011 382/145 |

(Continued)

FOREIGN PATENT DOCUMENTS

| | | |
|---|---|---|
| CN | 108292103 A | 7/2018 |
| KR | 101906098 B1 | 10/2018 |

(Continued)

OTHER PUBLICATIONS

PCT International Search Report and Written Opinion for International Application No. PCT/US2020/063857 dated Apr. 8, 2021, 7 pages.

(Continued)

*Primary Examiner* — Isiaka O Akanbi
(74) *Attorney, Agent, or Firm* — Suiter Swantz pc llo

(57) ABSTRACT

A metrology target includes a first target structure formed within at least one of a first area and a third area of a first layer of a sample, where the first target structure comprises a plurality of first cells containing one or more first cell pattern elements; and a second target structure formed within at least one of a second area and a fourth area of a second layer of the sample, the second target structure comprising a plurality of second cells containing one or more second cell pattern elements.

26 Claims, 10 Drawing Sheets

(56) References Cited

U.S. PATENT DOCUMENTS

| | | | |
|---|---|---|---|
| 2004/0137341 A1* | 7/2004 | Niu | G03F 7/70633 430/30 |
| 2007/0008533 A1* | 1/2007 | Ghinovker | G01N 21/4785 356/401 |
| 2007/0229829 A1 | 10/2007 | Kandel et al. | |
| 2008/0023855 A1* | 1/2008 | Ghinovker | G03F 7/70633 257/797 |
| 2008/0218767 A1 | 9/2008 | Mos et al. | |
| 2009/0087756 A1* | 4/2009 | Schulz | G03F 7/70633 430/5 |
| 2010/0005442 A1* | 1/2010 | Ghinovker | G06F 30/39 716/55 |
| 2013/0035888 A1 | 2/2013 | Kandel et al. | |
| 2013/0163852 A1* | 6/2013 | Ghinovker | G06T 7/0004 257/E23.179 |
| 2013/0293890 A1* | 11/2013 | Amir | G01B 11/14 356/401 |
| 2015/0177135 A1 | 6/2015 | Amit et al. | |
| 2016/0061589 A1* | 3/2016 | Bhattacharyya | G01B 11/14 356/620 |
| 2017/0090302 A1* | 3/2017 | Slotboom | G03F 7/70633 |
| 2019/0026885 A1* | 1/2019 | Gready | G05B 13/024 |
| 2019/0195782 A1* | 6/2019 | Shchegrov | G01N 21/211 |
| 2019/0250521 A1* | 8/2019 | Amit | G01N 21/9501 |
| 2019/0279841 A1* | 9/2019 | Xiao | H01J 37/026 |
| 2020/0201193 A1* | 6/2020 | Leshinsky-Altshuller | G03F 7/70683 |

FOREIGN PATENT DOCUMENTS

| | | |
|---|---|---|
| WO | 2018004511 A1 | 1/2018 |
| WO | 2019139390 A1 | 7/2019 |

OTHER PUBLICATIONS

Chinese Patent Office, Office Action dated Mar. 10, 2023, received in Chinese Patent Application No. 202080084526.6, 28 pages (including translation).

* cited by examiner

US 11,874,102 B2

THICK PHOTO RESIST LAYER METROLOGY TARGET

CROSS-REFERENCE TO RELATED APPLICATION

The present application claims the benefit under 35 U.S.C. § 119(e) of U.S. Provisional Application Ser. No. 62/955,243, filed Dec. 30, 2019, TPRIBO (THICK PHOTO RESIST IBO) A NEW IMAGE-BASED OVERLAY METROLOGY FOR THICK PHOTO RESIST LAYER PROCESS, naming Guo Lingyi and Pei Jincheng as inventors, which is incorporated herein by reference in the entirety.

TECHNICAL FIELD

The present disclosure is related generally to overlay metrology and, more particularly, to overlay metrology using metrology targets formed on thick photo resist layers.

BACKGROUND

Overlay metrology targets are typically designed to provide diagnostic information regarding the alignment of multiple layers of a sample by characterizing an overlay target having target features located on sample layers of interest. Further, the overlay alignment of the multiple layers is typically determined by aggregating overlay measurements of multiple overlay targets at various locations across the sample. However, the accuracy and/or repeatability of an overlay measurement of an overlay target may be sensitive to the particular location on a sample or the particular characteristics of the target features to be measured. For example, in the case of image-based overlay targets using thick photoresist layers, it is generally only relatively large target patterns that are feasible due to certain critical dimension limitations of the thick photoresist material. Additionally, this limitation of thick photoresist layers may result in target patterns being formed in such a way that the target patterns contain asymmetric features that decrease the accuracy of metrology measurements (e.g., the asymmetric features of the target patterns may introduced one or more overlay measurement errors that reduce the accuracy of an overlay measurement between two layers of a sample). Metrology target features of a small size may require the use of metrology systems and targets capable of achieving greater resolution of a sample target. In this regard, as chip sizes continually shrink, many samples contain small target features resolvable at varying resolutions. The inclusion of large patterns of metrology targets on a sample may result in undesirable effects, or may render overlay measurement impracticable. Accordingly, it may be desirable to provide a metrology target formed from a thick photo resist material configured for use in overlay metrology of samples having small target features (such as samples used in 3D NAND metrology processes).

SUMMARY

A metrology target is disclosed, in accordance with one or more embodiments of the present disclosure. In one embodiment, the metrology target includes a first target structure formed from a photoresist material, wherein the first target structure is formed within at least one of a first area and a third area of a first layer of a sample, the first target structure comprising a plurality of first cells containing one or more first cell pattern elements. In another embodiment, the metrology target includes a second target structure formed from a photoresist material, wherein the first target structure is formed within at least one of a second area and a fourth area of a second layer of the sample, the second target structure comprising a plurality of second cells containing one or more second cell pattern elements.

A metrology system is disclosed, in accordance with one or more embodiments of the present disclosure. In one embodiment, the metrology system includes a controller communicatively couplable to one or more metrology sub-systems, wherein the controller including one or more processors, wherein the one or more processors are configured to execute a set of program instructions maintained in memory, wherein the set of program instructions is configured to cause the one or more processors to: receive, from the one or more metrology sub-systems, one or more signals indicative of illumination emanating from one or more metrology targets of a sample, wherein the one or more metrology targets of the sample comprise: a first target structure formed from a photoresist material, wherein the first target structure is formed within at least one of a first area and a third area of a first layer of a sample, the first target structure comprising a plurality of first cells containing one or more first cell pattern elements; and a second target structure formed from a photoresist material, wherein the second target structure is formed within at least one of a second area and a fourth area of a second layer of the sample, the second target structure comprising a plurality of second cells containing one or more second cell pattern elements; generate one or more first overlay measurements based on one or more signals indicative of illumination emanating from one or more portions of the first target structure; generate one or more second overlay measurements based on one or more signals indicative of illumination emanating from one or more portions of the second target structure; and determine an overlay value of the sample based on the one or more first overlay measurements and the one or more second overlay measurements.

A method of measuring overlay of a sample is disclosed, in accordance with one or more embodiments of the present disclosure. In one embodiment, the method includes illuminating a sample including one or more metrology targets, the one or more metrology targets comprising: a first target structure formed from a photoresist material, wherein the first target structure is formed within at least one of a first area and a third area of a first layer of a sample, the first target structure comprising a plurality of first cells containing one or more first cell pattern elements; and a second target structure formed from a photoresist material, wherein the second target structure is formed within at least one of a second area and a fourth area of a second layer of the sample, the second target structure comprising a plurality of second cells containing one or more second cell pattern elements. In another embodiment, the method includes detecting illumination emanating from the one or more metrology targets of the sample. In another embodiment, the method includes generating one or more first overlay measurements based on one or more signals indicative of illumination emanating from one or more portions of the first target structure. In another embodiment, the method includes generating one or more second overlay measurements based on one or more signals indicative of illumination emanating from one or more portions of the second target structure. In another embodiment, the method includes determining an overlay value of the sample based on the one or more first overlay measurements and the one or more second overlay measurements.

A method of forming an overlay target is disclosed, in accordance with one or more embodiments of the present disclosure. In one embodiment, the method includes forming a first target structure from a photoresist material, wherein the first target structure is formed within at least one of a first area and a third area of a first layer of a sample, the first target structure comprising a plurality of first cells containing one or more first cell pattern elements. In another embodiment, the method includes forming a second target structure from a photoresist material, wherein the second target structure is formed within at least one of a second area and a fourth area of a second layer of the sample, the second target structure comprising a plurality of second cells containing one or more second cell pattern elements.

BRIEF DESCRIPTION OF DRAWINGS

The numerous advantages of the disclosure may be better understood by those skilled in the art by reference to the accompanying figures.

DETAILED DESCRIPTION

Figure 1A:
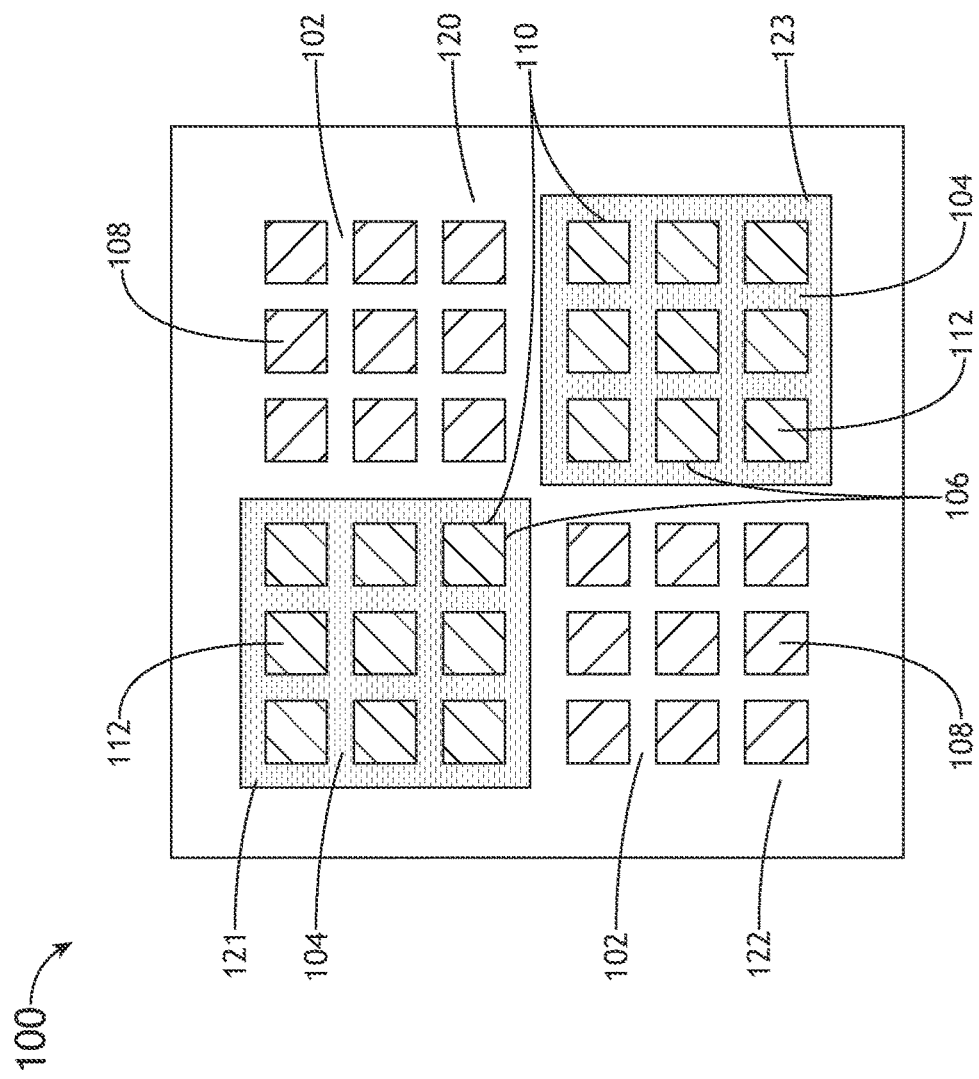
FIG. 1A is a top view of a metrology target, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to overlay metrology targets formed on thick photo resist layers.

A semiconductor device may be formed as multiple printed layers of patterned material on a substrate. Each printed layer may be fabricated through a series of process steps such as, but not limited to, one or more material deposition steps, one or more lithography steps, or one or more etching steps. In some fabrication processes, the printed layers may be formed using one or more photo resist materials. For example, a photo resist material may be deposited onto the substrate. The photo resist material may then be exposed to illumination, wherein the illumination produces a latent target pattern on the photo resist material. The latent target pattern (or a developed target pattern formed from the latent target pattern) may then be used as a pattern for one or more lithography and/or one or more etching steps configured to form a final target pattern on the substrate for use in overlay and/or metrology applications. In other fabrication processes, the photo resist material is exposed to illumination to produce a latent target pattern on the photo resist material, and the latent target pattern (or a developed target pattern formed from the latent target pattern) is used in overlay and/or metrology applications.

During fabrication, each printed layer must typically be fabricated within selected tolerances to properly construct the final device. For example, the relative placement of printed elements in each layer (e.g., the overlay or the overlay parameters) must be well characterized and controlled with respect to previously fabricated layers. Accordingly, metrology targets may be fabricated on one or more printed layers to enable efficient characterization of the overlay of the layers. Deviations of overlay target features on a printed layer may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Metrology targets may typically include well-defined printed elements designed to provide an accurate representation of one or more printing characteristics. In this regard, measured characteristics of printed elements of a metrology target (e.g., by a metrology tool) may be representative of printed device elements associated with a device being fabricated. Further, metrology targets are typically characterized as having one or more measurement cells, where each cell includes printed elements in one or more layers on the sample. A metrology measurement may then be based on any combination of measurements of the size, orientation, or location (e.g., pattern placement) of printed elements in a single cell or between multiple cells. For example, one or more cells of an overlay metrology target may include printed elements on two or more sample layers arranged such that the relative positions of elements of each layer may be indicative of offset errors (e.g. pattern placement errors (PPE)) in a particular layer or overlay errors associated with registration errors between sample layers. By way of another example, process-sensitive metrology targets may include printed elements on a single sample layer, where one or more characteristics of the printed elements (e.g., width or critical dimension (CD), sidewall angle, position, or the like) are indicative of one or more process metrics including, without limitation, the dose of illumination during a lithography step or a focal position of the sample in a lithography tool during a lithography step.

Overlay metrology is typically performed by fabricating one or more overlay targets across a sample, where each overlay target includes features in sample layers of interest, which are fabricated at the same time as features associated with a device or component being fabricated. In this regard, overlay errors measured at a location of an overlay target may be representative of overlay errors of device features. Accordingly, overlay measurements may be used to monitor and/or control any number of fabrication tools to maintain production of devices according to specified tolerances. For example, overlay measurements of a current layer with respect to a previous layer on one sample may be utilized as feed-back data to monitor and/or mitigate deviations of the fabrication of the current layer on additional samples within a lot. By way of another example, overlay measurements of a current layer with respect to a previous layer on one sample may be utilized as feed-forward data to fabricate a subsequent layer on the same sample in a way that takes into account the existing layer alignments.

Overlay targets typically include features specifically designed to be sensitive to overlay errors between sample layers of interest. An overlay measurement may then be carried out by characterizing the overlay target using an overlay metrology tool and applying an algorithm to determine overlay errors on the sample based on the output of the metrology tool.

Regardless of the overlay measurement technique, an overlay metrology tool is typically configurable according to a recipe including a set of measurement parameters utilized to generate an overlay signal. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

Overlay metrology tools may utilize a variety of techniques to determine the overlay of sample layers. For example, image-based overlay metrology tools may illuminate an overlay target (e.g., an advanced imaging metrology (AIM) target, a box-in-box metrology target, or the like) and capture an overlay signal including an image of overlay target features located on different sample layers. Accordingly, overlay may be determined by measuring the relative positions of the overlay target features. By way of another example, scatterometry-based overlay metrology tools may illuminate an overlay target (e.g., a grating-over-grating metrology target, or the like) and capture an overlay signal including an angular distribution of radiation emanating from the overlay target associated with diffraction, scattering, and/or reflection of the illumination beam. Accordingly, overlay may be determined based on models of the interaction of an illumination beam with the overlay target.

It is recognized herein that various overlay metrology tools may be used to measure overlay. For example, optical metrology tools (e.g., light-based metrology tools using electromagnetic radiation for illumination and/or detection) may provide high-throughput overlay measurements using numerous techniques such as, but not limited to, determining relative positions of spatially-separated features on multiple layers in an image, directly measuring PPE on multiple layers, or scatterometry in which overlay is determined based on light scattered and/or diffracted from diffraction gratings on multiple layers. For the purposes of the present disclosure, the term "optical metrology tools," "optical metrology techniques," and the like indicate metrology tools and techniques using electromagnetic radiation of any wavelength such as, but not limited to, x-ray wavelengths, extreme ultraviolet (EUV) wavelengths, vacuum ultraviolet (VUV) wavelengths, deep ultraviolet (DUV) wavelengths, ultraviolet (UV) wavelengths, visible wavelengths, or infrared (IR) wavelengths. Systems, methods, and apparatuses related to overlay measurement are generally described in U.S. Pat. No. 8,330,281 titled "OVERLAY MARKS, METHODS OF OVERLAY MARK DESIGN AND METHODS OF OVERLAY MEASUREMENTS" and issued on Dec. 11, 2012, U.S. Pat. No. 9,476,698 titled "PERIODIC PATTERNS AND TECHNIQUE TO CONTROL MISALIGNMENT BETWEEN TWO LAYERS" and issued on Oct. 25, 2016, U.S. Pat. No. 7,541,201 titled "APPARATUS AND METHODS FOR DETERMINING OVERLAY OF STRUCTURES HAVING ROTATIONAL OR MIRROR SYMMETRY" and issued on Jun. 2, 2009, U.S. Patent Publication No. 2013/0035888 titled "METHOD AND SYSTEM FOR PROVIDING A QUALITY METRIC FOR IMPROVED PROCESS CONTROL" and published on Feb. 7, 2013, U.S. Pat. No. 9,214,317 titled "SYSTEM AND METHOD OF SEM OVERLAY METROLOGY" issued on Dec. 15, 2015, U.S. Pat. No. 10,527,951 B2 titled "COMPOUND IMAGING METROLOGY TARGETS" issued on Jan. 7, 2020, U.S. Pat. No. 10,190,979 B2 titled "METROLOGY IMAGING TARGETS HAVING REFLECTION-SYMMETRIC PAIRS OF REFLECTION-ASYMMETRIC STRUCTURES" issued on Jan. 29, 2019, and PCT Application No. PCT/US2016/039531 titled "APPARATUS AND METHOD FOR THE MEASUREMENT OF PATTERN PLACEMENT AND SIZE OF PATTERN AND COMPUTER PROGRAM THEREFOR" and filed on Jun. 27, 2016, all of which are incorporated herein by reference in their entirety.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a top view of a metrology target 100, in accordance with one or more embodiments of the present disclosure. The metrology target 100 may include a first target structure 102 formed within at least one of a first area 120 and a third area 122 of a first layer of a sample, and a second target structure 104 formed within at least one of a second area 121 and a fourth area 123 of a second layer of the sample. The first target structure 102 may be two-fold rotationally symmetric to the second target structure 104 about a common center of rotational symmetry.

In some embodiments, the first target structure 102 may include a plurality of first cells 106 formed on a first layer of a sample (as may be indicated by light pattern features in FIG. 1A). The plurality of first cells 106 may be configured as one or more first periodically patterned grids (e.g., the first cells of the plurality of first cells may be formed as cubic grids). The plurality of first cells 106 may include one or more first cell pattern elements 108. For example, the one or more first cell pattern elements 108 may include any pattern element compatible with any optical metrology mode known in the art to be suitable for the purposes contemplated by the present disclosure, including, without limitation, advanced imaging metrology (AIM), advanced imaging metrology in-die (AIMid), and triple advanced imaging metrology (Triple AIM). The one or more first cell pattern elements 108 may include one or more segmented portions (e.g., repeated, periodic sets of reference features).

The one or more first periodically patterned grids may be configured such that each of the plurality of first cells 106 of the first periodically patterned grids has an equivalent critical dimension. For example, each of the first cells 106 of a particular first periodically patterned grid may be of an equivalent cubic shape, wherein the length and width of each of the first cells 106 are equivalent. By way of another example, each of the first cells 106 of a particular first periodically patterned grid may be of equal distance from each one or more other first cells 106 of the particular first periodically patterned grid (e.g., the plurality of first cells 106 may configured such that each of the first periodically patterned grids has an equivalent periodic pitch with respect to the plurality of first cells 106). In some embodiments, the critical dimension of each of the first cells 106 of each of the one or more first periodically patterned grids may be equivalent, and the periodic pitch of each of the one or more first periodically patterned grids may be equivalent.

In some embodiments, the second target structure 104 may include a plurality of second cells 110 formed on a second layer of the sample (as may be indicated by dark pattern features in FIG. 1A). The plurality of second cells 110 may be configured as one or more second periodically patterned grids (e.g., the second cells of the plurality of second cells may be formed as cubic grids). The plurality of second cells 110 may include one or more second cell pattern elements 112. For example, the one or more second cell pattern elements 112 may include any pattern element compatible with any optical metrology mode known in the art to be suitable for the purposes contemplated by the present disclosure, including, without limitation, advanced imaging metrology (AIM), advanced imaging metrology in-die (AIMid), and triple advanced imaging metrology (Triple AIM). Portions of the one or more second cell pattern elements 112 may be formed at multiple layers of the metrology target 100. The one or more second cell pattern elements 112 may include one or more segmented portions (e.g., repeated, periodic sets of reference features).

The one or more second periodically patterned grids may be configured such that each of the plurality of second cells 110 of the second periodically patterned grids has an equivalent critical dimension. For example, each of the second cells 110 of a particular second periodically patterned grid may be of an equivalent cubic shape, wherein the length and width of each of the second cells 110 are equivalent. By way of another example, each of the second cells 110 of a particular first periodically patterned grid may be of equal distance from each of the one or more other second cells 110 of the particular second periodically patterned grid (e.g., the plurality of second cells 110 may configured such that each of the second periodically patterned grids has an equivalent periodic pitch with respect to the plurality of second cells 110). In some embodiments, the critical dimension of each of the second cells 110 of each of the one or more second periodically patterned grids may be equivalent, and the periodic pitch of each of the one or more second periodically patterned grids may be equivalent.

In one embodiment, as shown in FIG. 1A, the metrology target 100 may include a first target structure 102 having a plurality of first cells 106 comprising two first periodically patterned grids. The metrology target 100 may include a second target structure 104 having a plurality of second cells 110 comprising two second periodically patterned grids. Each of the first periodically patterned grids and each of the second periodically patterned grids may be configured as a three-by-three ("3×3") periodic grid. In this regard, each of the first periodically patterned grids and each of the second periodically patterned grids may include nine first cells and nine second cells, respectively.

The two first periodically patterned grids may be formed within a first quadrant and a third quadrant of an area of the first layer of the sample. For example, a first periodically patterned grid may be formed within a first quadrant of an area of the first layer of the sample, and another first periodically patterned grid may be formed within a third quadrant of an area of the first layer of the sample.

The two second periodically patterned grids may be formed within a second quadrant and a fourth quadrant of an area of the second layer of the sample. For example, a second periodically patterned grid may be formed within a second quadrant of an area of the second layer of the sample, and another second periodically patterned grid may be formed within a fourth quadrant of an area of the second layer of the sample.

As used herein, the term "quadrant" may refer to a portion of an area of a sample layer that comprises an equal fourth (e.g., by surface area) of the area of the sample layer. Cardinal descriptions of quadrants (e.g., first, second, and the like) are used for illustrative purposes only, and are intended to identify discrete portions of a particular layer of the sample. For example, a portion of an area of a sample layer that comprises an equal fourth of the area of the sample layer and that comprises the upper-right portion of the area of the sample layer may be referred to as the "first" quadrant. By way of another example, a portion of an area of a sample layer that comprises an equal fourth of the area of the sample layer and that comprises the upper-left portion of the area of the sample layer may be referred to as the "second" quadrant. By way of another example, a portion of an area of a sample layer that comprises an equal fourth of the area of the sample layer and that comprises the lower-left portion of the area of the sample layer may be referred to as the "third" quadrant. By way of another example, a portion of an area of a sample layer that comprises an equal fourth of the area of the sample layer and that comprises the lower-right portion of the area of the sample layer may be referred to as the "fourth" quadrant.

The first cell pattern elements 108, as shown in FIG. 1A, may include one or more pattern element lines formed within each of the first cells 106. The second cell pattern elements 112 may include one or more pattern element lines, wherein the one or more pattern element lines of the second cell pattern elements 112 have an opposite angle (e.g., a congruent angle rotated 90 degrees) relative to the one or more pattern element lines of the first cell pattern elements 108.

Figure 1B:
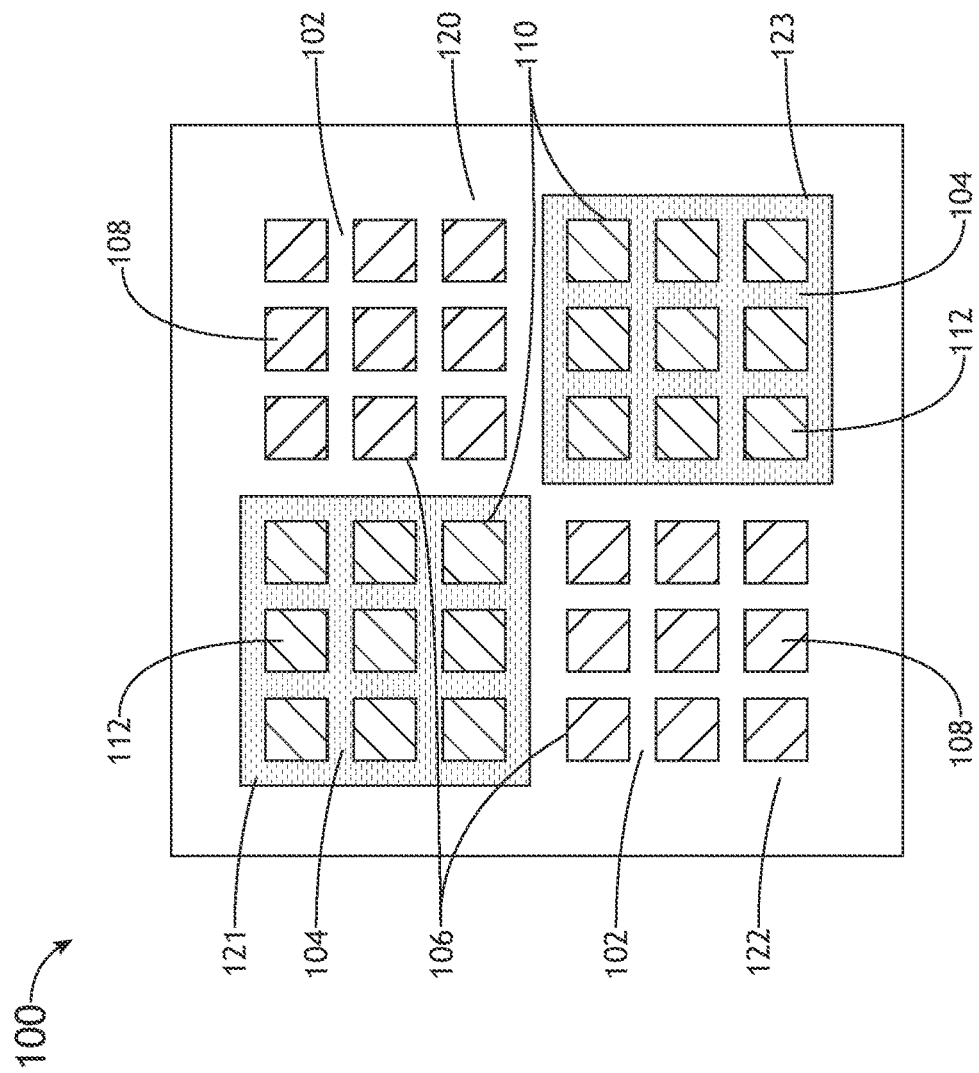
FIG. 1B is a top view of a metrology target, in accordance with one or more embodiments of the present disclosure.

In another embodiment, as shown in FIG. 1B, the first cell pattern elements 108 may include a plurality of pattern element lines formed within each of the first cells 106. For example, the first cell pattern elements 108 may include a plurality of parallel pattern element lines formed within each of the first cells 106. The second cell pattern elements 112 may include a plurality of pattern element lines formed within each of the second cells 110, wherein the plurality of pattern element lines formed within each of the second cells 110 have an opposite angle (e.g., a congruent angle rotated 90 degrees) relative to the one or more pattern element lines of the first cell pattern elements 108.

Figure 1C:
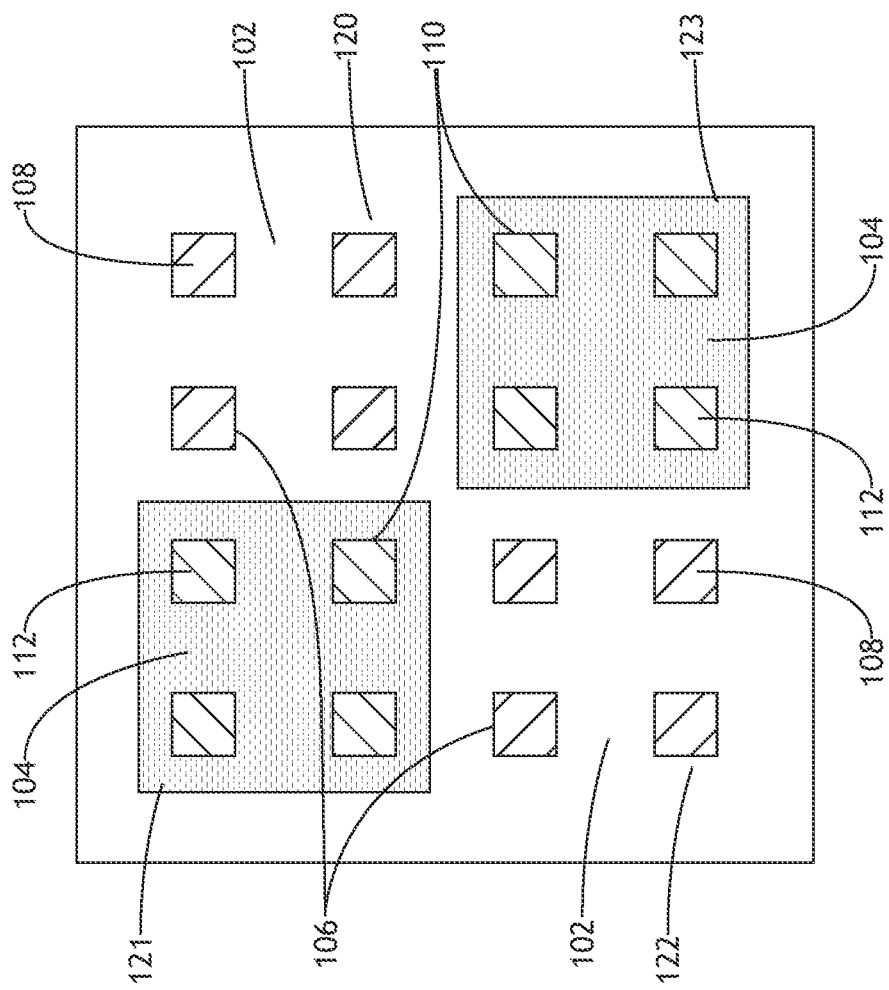
FIG. 1C is a top view of a metrology target, in accordance with one or more embodiments of the present disclosure.

In another embodiment, as shown in FIG. 1C, the metrology target 100 may include a first target structure 102 having a plurality of first cells 106 comprising two first periodically patterned grids. The metrology target 100 may include a second target structure 104 having a plurality of second cells 110 comprising two second periodically patterned grids. Each of the first periodically patterned grids and each of the second periodically patterned grids may be configured as a two-by-two ("2×2") periodic grid. In this regard, each of the first periodically patterned grids and each of the second periodically patterned grids may include four first cells and four second cells, respectively.

Figure 1D:
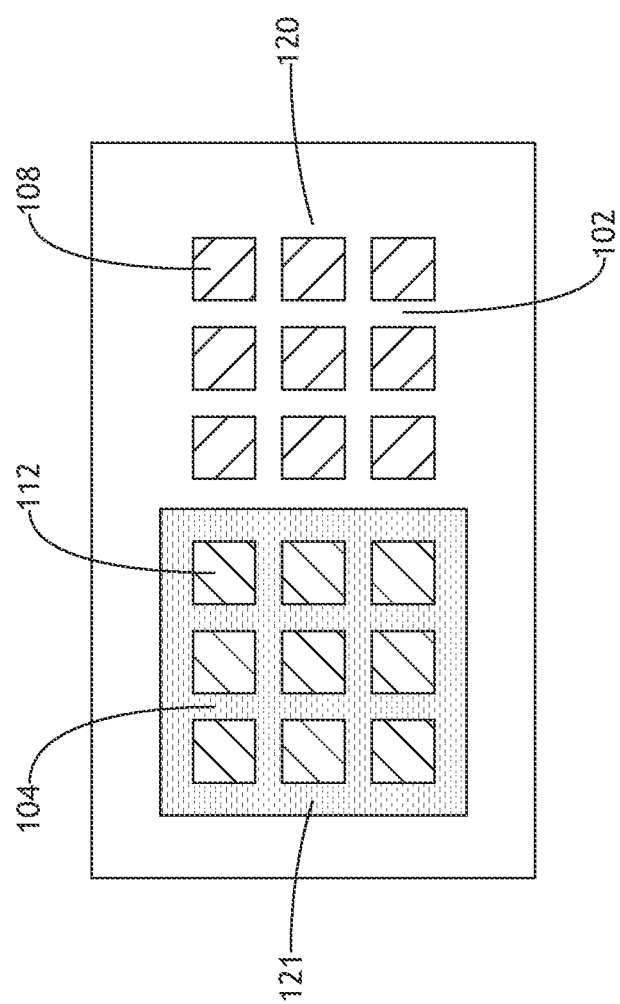
FIG. 1D is a top view of a metrology target, in accordance with one or more embodiments of the present disclosure.
Figure 1E:
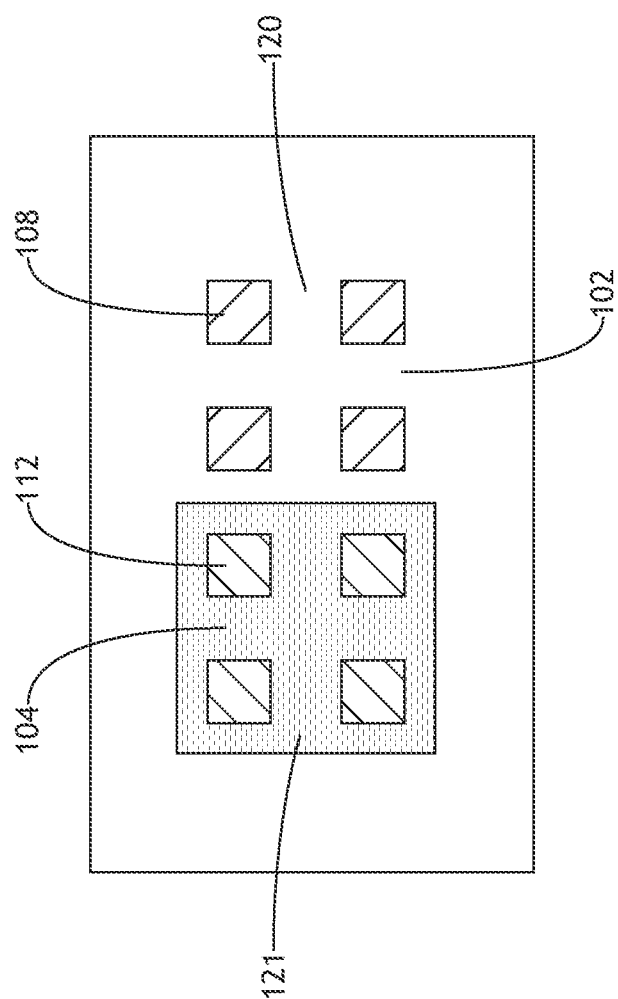
FIG. 1E is a top view of a metrology target, in accordance with one or more embodiments of the present disclosure.

In some embodiments, the metrology target 100 may be configured to occupy a smaller amount of surface area on a substrate. For example, as shown in FIG. 1D, the metrology target 100 may be configured to include a single first periodically patterned grid and a single second periodically patterned grid. In this regard, the metrology target 100 may include a first target structure 102 having a plurality of first cells 106 comprising a first periodically patterned grid. The metrology target 100 may include a second target structure 104 having a plurality of second cells 110 comprising a second periodically patterned grid. The first periodically patterned grid and the second periodically patterned grid may each be configured as a three-by-three ("3×3") periodic grid. By way of another example, as shown in FIG. 1E, the first periodically patterned grid and the second periodically patterned grid may each be configured as a two-by-two ("2×2") periodic grid. It is noted that the metrology target 100 may be of various sizes configured to be used in close proximity to sample features. For example, the metrology target 100 may be produced as an in-die (e.g., along a scribe line) metrology target. By way of another example, the metrology target 100 may be formed in-die based on design restrictions, spacing, surrounding features of the sample, and the like. In this regard, the metrology target 100 may be configured for use with any in-die metrology mode, including, without limitation, AIMid.

The metrology target 100 (and/or any portion thereof) may be formed from any material known in the art to be suitable for the purposes contemplated by the present disclosure, including, without limitation, a photo resist or thick photo resist material. material (e.g., a photo resist having a thickness greater than two micrometers) It is noted that the dimensions of the metrology target 100 and/or its components (e.g., the first cells 106, the second cells 110, the first periodically patterned grid, and/or the second periodically patterned grid) may vary with a thickness of one or more portions of the metrology target 100 (e.g., a thickness of the first layer, the second layer, a photoresist material used to form the first target structure and/or the one or more first cell pattern elements, a photoresist material used to form the second target structure and/or the one or more second cell pattern elements). For example, as the thickness of one or more portions of the metrology target 100 increases, one or more other dimensions of one or more components of the metrology target 100 may increase. Conversely, as the thickness of one or more portions of the metrology target 100 decreases, one or more other dimensions of one or more components of the metrology target 100 may decrease. As an illustrative example, and without limiting the generality of the present disclosure, in one or more embodiments, a length and/or a width of the metrology target 100 may range from approximately 30 μm to approximately 34 μm, where the term "approximately" is intended to include those values within 6 μm of the foregoing values. Each of the first cells 106 and the second cells 110 may have a length that is equal to or greater than 3 μm, and a width that is equal to or greater than 3 μm. The metrology target 100 may have a thickness of approximately 10 μm, where the term "approximately" is intended to include those values within 20 μm of the foregoing value. As another example, a thick photo resist material may have a thickness greater than 2 micrometers. As another example, a thick photo resist material may have a thickness greater than 2 micrometers. It is specifically noted that the foregoing dimensions (or ranges of dimensions) related to the metrology target 100 and/or its components are not intended to be limiting. For example, a length and/or width of the metrology target 100 may of a value lesser or greater than those values falling within the range of the foregoing example. By way of another example, each of the first cells 106 and each of the second cells 110 may have a length and/or width that is lesser or greater than those values falling within the range of the foregoing example.

It is noted that the pattern elements of the metrology target 100 (e.g., the first cell pattern elements 108 and the second cell pattern elements 112) may be configured such that incident radiation directed to one or more portions of the first cell pattern elements 108 and/or the second cell pattern elements 112 may be diffracted by the one or more portions of the first cell pattern elements 108 and/or the second cell pattern elements 112, and the diffracted radiation may be detected and analyzed (e.g., by one or more metrology systems) to determine one or more overlay measurements based on the diffracted radiation and/or one or more signals indicative of the diffracted radiation.

It is additionally noted that the embodiments of the present disclosure are not limited to the one or more first periodically patterned grids and the one or more second periodically patterned grids having an equivalent pitch. For example, it is expressly contemplated that the one or more first periodically patterned grids may have a pitch that is not equivalent to a pitch of the one or more second periodically patterned grids. In this regard, each of the one or more first periodically patterned grids may be of a different period relative to each of the one or more second periodically patterned grids. Further, it is noted that the embodiments of the present disclosure are not limited to the plurality of first cells 106 having a critical dimension equivalent to a critical dimension of the plurality of second cells 110. For example, each of the first cells 106 may be of a different length and/or width relative to the second cells 110.

It is to be understood that while the metrology target 100 is described in the context of an example target and target structure displaying two-fold symmetry, this feature should not be interpreted as a limitation on the scope of the present disclosure. Rather, it is noted herein that the metrology target 100 and/or the first target structure 102 and the second target structure 104 may display four-fold rotational symmetry.

It is noted that the embodiments of the present disclosure, including, without limitation, the components of the metrology target 100 (e.g., the first periodically patterned grid, the second periodically patterned grid, the one or more first cells 106, the one or more second cells 110, the one or more first cell pattern elements 108, and/or the one or more second cell pattern elements 112) may be configured to overcome and/or mitigate the one or more undesirable effects that may arise from one or more limitations of using thick photoresist layers to form image-based overlay targets. As an illustration, a photo resist with a thickness greater than 2 micrometers may result in features with asymmetric profiles that may impact overlay generated using traditional techniques. For example, the components of the metrology target 100 may be configured to reduce the overall size of a target pattern formed on the metrology target 100. By way of another example, the first target structure 102 and/or the second target structure 104 may be configured to reduce the overall size of (e.g., the area of a sample occupied by) a formed target feature, such that one or more undesirable effects (e.g., asymmetry of the thick photoresist target feature formation) may be reduced. By way of another example, the presence of periodic features in at least the second cell pattern elements 112 may provide more information than a traditional box-in-box design based on the repeating pattern, which may mitigate errors associated with asymmetries (e.g., target profile asymmetries) and thus promote accurate overlay determination using image-based techniques. By way of another example, the presence of periodic features in at least the second cell pattern elements 112 may further provide an enlarged process window to mitigate the impact of defects. In this way, the components of the metrology target 100 may be configured to provide a metrology target that mitigates asymmetry and other unwanted effects arising from the use of thick photoresist material in image-based overlay metrology targets, and that increases accuracy of overlay measurements performed on samples having the metrology target 100.

Figure 2:
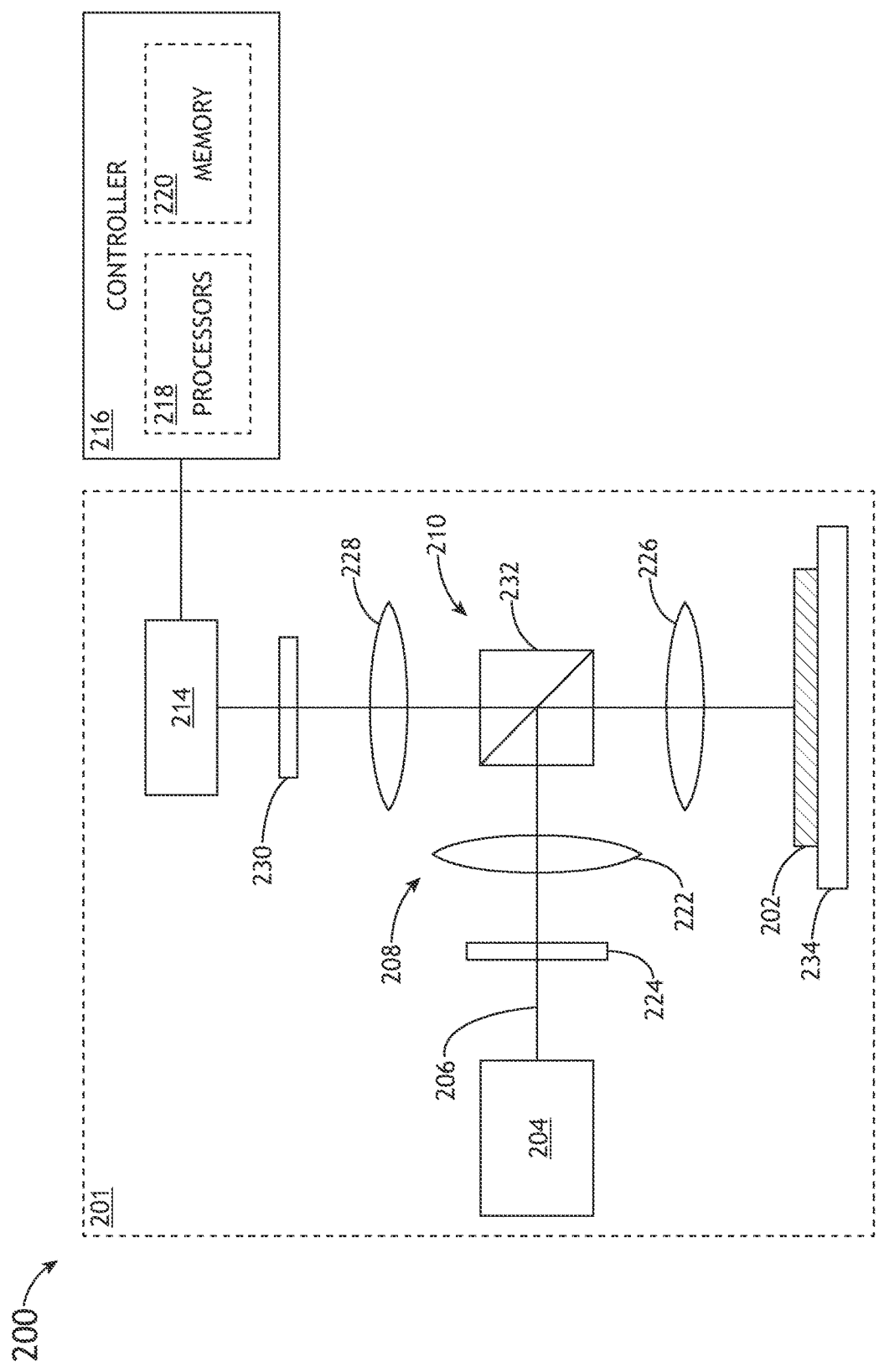
FIG. 2 is a conceptual view of a metrology system, in accordance with one or more embodiments of the present disclosure.

FIG. 2 is a conceptual view illustrating a metrology system 200, in accordance with one or more embodiments of the present disclosure. In one embodiment, the metrology system 200 includes a metrology sub-system 201 which may be configured to acquire overlay signals from overlay targets based on any number of overlay recipes. The metrology sub-system 201 may operate in an imaging mode. For example, in an imaging mode, individual overlay target elements may be resolvable within the illuminated spot on the sample (e.g., as part of a bright-field image, a dark-field image, a phase-contrast image, or the like).

In one embodiment, the metrology sub-system 201 may direct illumination to a sample and may further collect radiation emanating from the sample to generate an overlay signal suitable for the determination of overlay of two or more sample layers. The metrology sub-system 201 may be configurable to generate overlay signals based on any number of recipes defining measurement parameters for the acquiring an overlay signal suitable for determining overlay of an overlay target. For example, a recipe the metrology sub-system 201 may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like.

For example, the metrology sub-system 201 may include any type of optical metrology tool known in the art suitable for generating metrology data of a sample, including, without limitation, an optical metrology tool configured to generate and/or detect an optical illumination beam having x-ray, ultraviolet (UV), infrared (IR), or visible light wavelengths. By way of another example, the metrology sub-system 201 may include an advanced imaging metrology (AIM) tool, an advanced imaging metrology in-die (AIMid) tool, or a triple advanced imaging metrology (Triple AIM) tool.

In another embodiment, the metrology sub-system 201 includes an optical illumination source 204 configured to generate an optical illumination beam 206. The optical illumination beam 206 may include one or more selected wavelengths of radiation including, but not limited to, x-ray, ultraviolet (UV) light, visible light, or infrared (IR) light. The optical illumination source 204 may be any type of illumination source known in the art suitable for generating an optical illumination beam 206. In one embodiment, the optical illumination source 204 is a laser source. For example, the optical illumination source 204 may include, but is not limited to, one or more narrowband laser sources, a broadband laser source, a supercontinuum laser source, a white light laser source, or the like. In this regard, the optical illumination source 204 may provide an optical illumination beam 206 having high coherence (e.g., high spatial coherence and/or temporal coherence). In another embodiment, the optical illumination source 204 includes a laser-sustained plasma (LSP) source. For example, the optical illumination source 204 may include, but is not limited to, a LSP lamp, a LSP bulb, or a LSP chamber suitable for containing one or more elements that, when excited by a laser source into a plasma state, may emit broadband illumination. In another embodiment, the optical illumination source 204 includes a lamp source. For example, the optical illumination source 204 may include, but is not limited to, an arc lamp, a discharge lamp, an electrode-less lamp, or the like. In this regard, the optical illumination source 204 may provide an optical illumination beam 206 having low coherence (e.g., low spatial coherence and/or temporal coherence).

The optical illumination source 204 may be configured to direct the optical illumination beam 206 to a sample 202 via an illumination pathway 208. The illumination pathway 208 may include one or more illumination pathway lenses 222 or additional optical components 224 suitable for modifying and/or conditioning the optical illumination beam 206. For example, the one or more optical components 224 may include, but are not limited to, one or more polarizers, one or more filters, one or more beam splitters, one or more diffusers, one or more homogenizers, one or more apodizers, or one or more beam shapers. The illumination pathway 208 may further include an objective lens 232 configured to direct the optical illumination beam 206 to the sample 202.

In another embodiment, the sample 202 is disposed on a sample stage 234. The sample stage 234 may include any device suitable for positioning and/or scanning the sample 202 within the metrology sub-system 201. For example, the sample stage 234 may include any combination of linear translation stages, rotational stages, tip/tilt stages, or the like.

In another embodiment, the second metrology sub-system 201 includes a detector 214 configured to capture light emanating from the sample 202 through a collection pathway 210. The collection pathway 210 may include, but is not limited to, one or more collection pathway lenses 228 for collecting light from the sample 202. For example, a detector 214 may receive light reflected or scattered (e.g., via specular reflection, diffuse reflection, and the like) from the sample 202 via one or more collection pathway lenses 228. By way of another example, a detector 214 may receive light generated by the sample 202 (e.g., luminescence associated with absorption of the optical illumination beam 818, or the like). By way of another example, the detector 214 may receive one or more diffracted orders of light from the sample 202 (e.g., 0-order diffraction, ±1 order diffraction, ±2 order diffraction, and the like).

The detector 214 may include any type of detector known in the art suitable for measuring illumination received from the sample 202. For example, the detector 214 may include, but is not limited to, a CCD detector, a TDI detector, a photomultiplier tube (PMT), an avalanche photodiode (APD), a complementary metal-oxide-semiconductor (CMOS) sensor, or the like. In another embodiment, the detector 214 may include a spectroscopic detector suitable for identifying wavelengths of light emanating from the sample 202.

In one embodiment, the detector 214 is positioned approximately normal to the surface of the sample 202. In another embodiment, the metrology sub-system 201 includes a beamsplitter oriented such that the objective lens 232 may simultaneously direct the optical illumination beam 206 to the sample 202 and collect light emanating from the sample 202. Further, the illumination pathway 208 and the collection pathway 210 may share one or more additional elements (e.g., objective lens 232, apertures, filters, or the like).

In another embodiment, the metrology system 200 includes a controller 216 communicatively coupled to the metrology sub-system 201. The controller 216 may be configured to direct the metrology sub-system 201 to generate overlay signals based on one or more selected recipes. The controller 216 may be further configured to receive data including, but not limited to, overlay signals from the metrology sub-system 201. Additionally, the controller 216 may be configured to determine overlay associated with an overlay target based on the acquired overlay signals.

The controller 216 may be configured to determine an overlay value of the sample 202 based on one or more overlay measurements of the sample. For example, the controller 216 may be configured to generate one or more first overlay measurements of the sample 202 based on one or more signals indicative of illumination emanating from one or more portions of the first target structure 102. The one or more first overlay measurements of the sample 202 may correspond to an overlay position of the first layer of the sample 202. By way of another example, the controller 216 may be configured to generate one or more second overlay measurements of the sample 202 based on one or more signals indicative of illumination emanating from one or more portions of the second target structure 104. The one or more second overlay measurements of the sample 202 may correspond to an overlay position of the second layer of the sample 202.

The one or more first overlay measurements of the sample 202 may include one or more measurements indicative of one or more first layer centers of gravity. For example, a center of gravity for each of the first cells 106 may be generated based on averaging center of gravity positions of each of the associated first cell pattern elements 108 individually. Subsequently, a center of gravity for the first layer 102 may be generated based on averaging the center of gravity positions of the first cells 106.

The one or more second overlay measurements of the sample 202 may include one or more measurements indicative of one or more second layer centers of gravity. For example, a center of gravity for each of the second cells 110 may be generated based on averaging center of gravity positions of each of the associated second cell pattern elements 112 determined individually. Subsequently, a center of gravity for the second target structure 104 may be generated based on averaging the center of gravity positions of the second cells 110.

The overlay value of the sample 202 may include a difference between one or more first layer centers of gravity and one or more second layer centers of gravity. For example, the controller 216 may be configured to compute a difference between the one or more first layer centers of gravity and the one or more second layer centers of gravity. Put another way, the controller 216 may be configured to determine the relative centers of gravity of the first layer of the sample 202 and the second layer of the sample 202. In this regard, the overlay value of the sample 202 may be indicative of a relative position of the first layer of the sample 202 and the second layer of the sample 202. In this sense, the controller 216 may be configured to determine an offset (e.g., PPE) between the first layer and the second layer of the sample 202. It is noted herein that, in computing the difference between the one or more first layer centers of gravity and the one or more second layer centers of gravity, the controller 216 may be configured to make such computation based on an average of a plurality of determined first layer centers of gravity (e.g., a plurality of first layer centers of gravity determined based on a plurality of pairs of points on the first layer of the sample 202) and an average of a plurality of determined second layer centers of gravity (e.g., a plurality of second layer centers of gravity determined based on a plurality of pairs of points on the second layer of the sample 202).

Figure 3A:
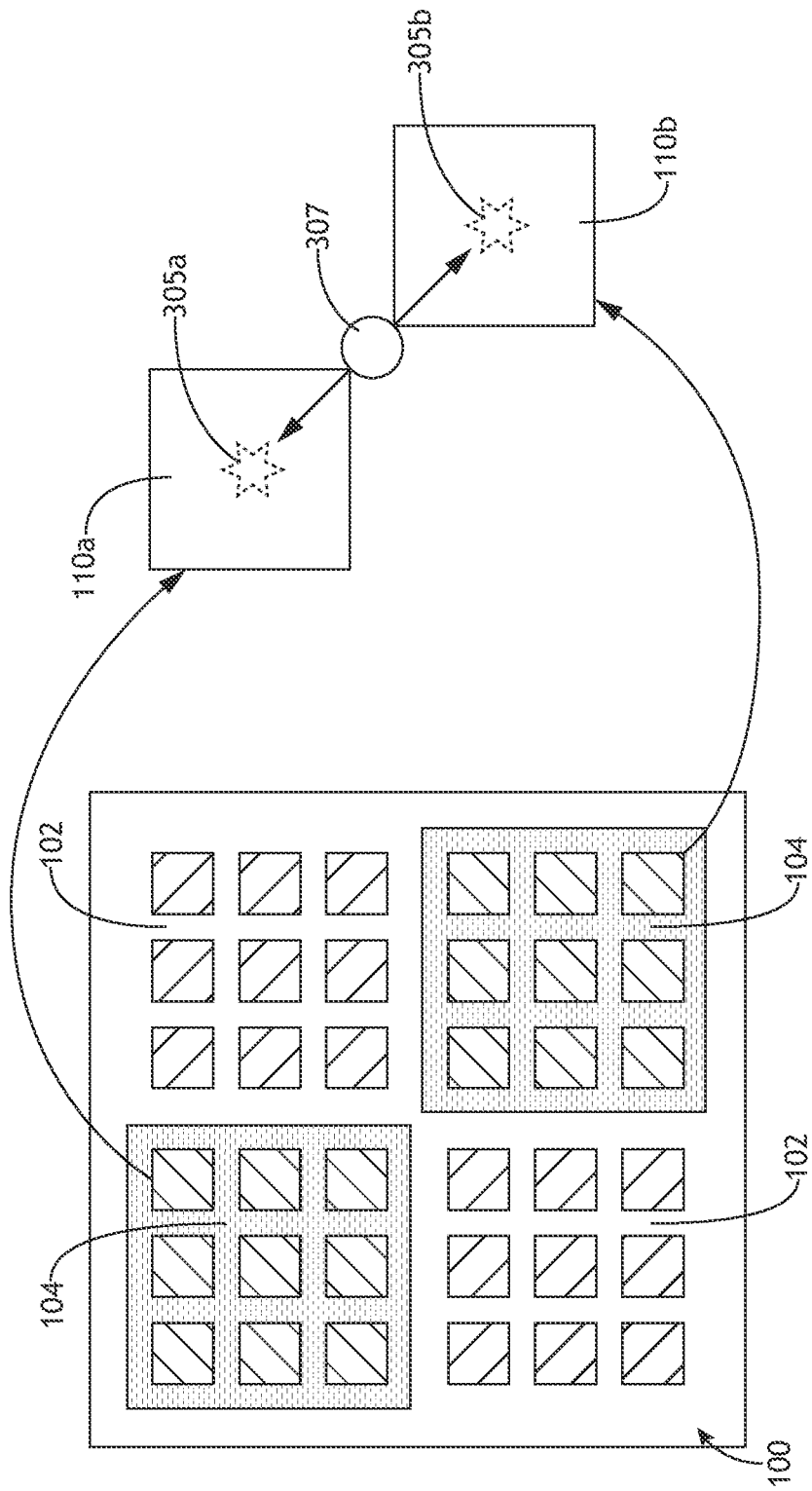
FIG. 3A illustrates a conceptual view of a determination of an overlay value of a metrology target 100, in accordance with one or more embodiments of the present disclosure.

FIG. 3A illustrates a conceptual view of a determination of an overlay value of a metrology target 100, in accordance with one or more embodiments of the present disclosure. As previously described herein, the controller 216 may be configured to determine one or more second layer centers of gravity based on one or more measurements indicative of the one or more second layer centers of gravity. For example, the controller 216 may be configured to determine a second layer center of gravity 307 based on one or more measurements indicative of a center of gravity position 305a of a second cell 110a and one or more measurements indicative of a center of gravity position 305b of a second cell 110b.

It is noted that while the embodiments shown in FIG. 3A illustrate the determination of a second layer center of gravity, this illustration is not intended to be illustrative. For example, as previously described, it is specifically contemplated that the controller 216 may be configured to determine a first layer center of gravity based on the one or more first overlay measurements in the same manner in which the controller 216 may determine the second layer center of gravity. In this regard, the controller 216 may be configured to determine the one or more first layer centers of gravity based on one or more measurement indicative of the one or more first layer centers of gravity (e.g., one or more relative position measurements corresponding to two points of the first layer).

Figure 3B:
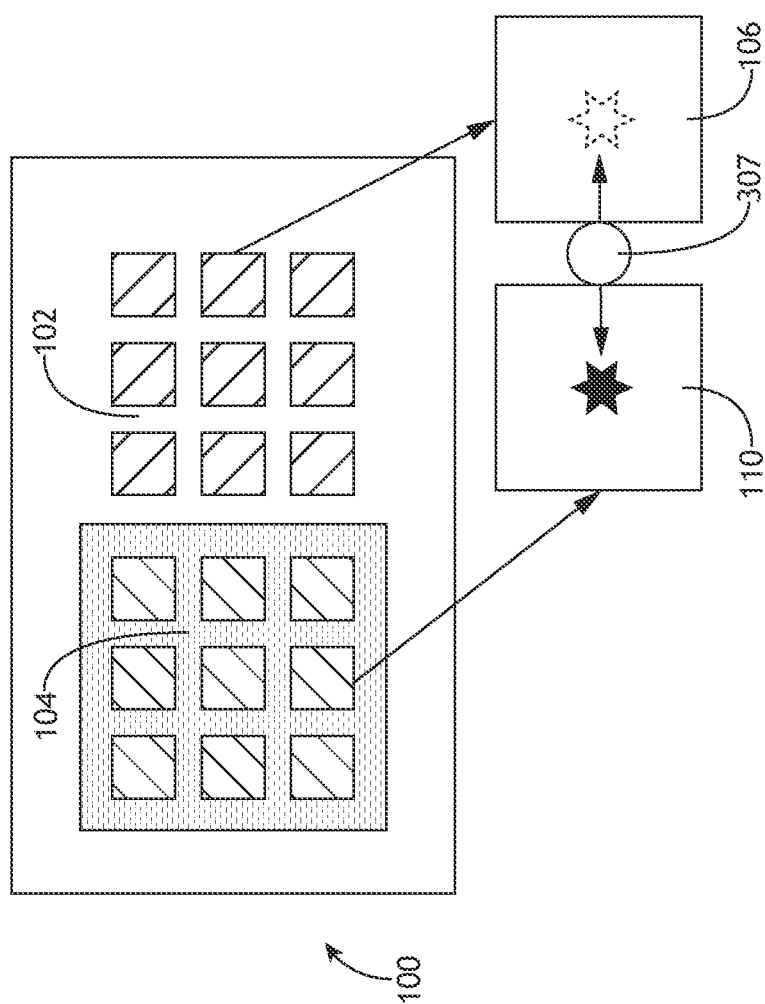
FIG. 3B illustrates a conceptual view of a determination of an overlay value of a metrology target 100, in accordance with one or more embodiments of the present disclosure.

FIG. 3B illustrates a conceptual view of a determination of an overlay value of a metrology target 100, in accordance with one or more embodiments of the present disclosure. The controller 216 may be configured to determine the overlay value of the sample 202 by reference to one or more design files. For example, the controller 216 may be configured to generate a center of gravity of the metrology target 100 as a whole. In this regard, the controller 216 may compute the center of gravity of the metrology target 100 based on one or more overlay measurements corresponding to any point of the metrology target 100. For example, the controller 216 may generate one or more overlay measurements corresponding to one or more points of the first layer of the sample 202 (e.g., a first cell 106), and one or more overlay measurements corresponding to one or more points of the second layer of the sample 202 (e.g., a second cell 110), and the controller 216 may determine one or more centers of gravity of the metrology target 100 based on such overlay measurements. The controller 216 may compute a difference between the one or more centers of gravity of the metrology target 100 and an expected center of gravity based on one or more design files corresponding to the metrology target 100. In this sense, the controller 216 may be configured to determine an offset (e.g., PPE) a portion of the metrology target 100 and the anticipated placement of such portion of the metrology target 100 based on the design files. It is noted herein that, in computing the difference between the one or more centers of gravity of the metrology target 100 and the expected center of gravity, the controller 216 may be configured to make such computation based on an average of a plurality of determined centers of gravity of the metrology target.

The one or more processors 218 may be configured to execute a set of program instructions maintained in a memory device 220, or memory. The one or more processors 218 may include any processing element known in the art. In this sense, the one or more processors 218 may include any microprocessor-type device configured to execute algorithms and/or instructions. Further, the memory device 220 may include any storage medium known in the art suitable for storing program instructions executable by the associated one or more processors 218. For example, the memory device 220 may include a non-transitory memory medium. As an additional example, the memory device 220 may include, but is not limited to, a read-only memory, a random-access memory, a magnetic or optical memory device (e.g., disk), a magnetic tape, a solid-state drive and the like. It is further noted that memory device 220 may be housed in a common controller housing with the one or more processors 218.

The one or more processors 218 of the controller 216 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 218 may include any device configured to execute algorithms and/or instructions (e.g., program instructions stored in memory). In one embodiment, the one or more processors 218 may be embodied as a desktop computer, mainframe computer system, workstation, image computer, parallel processor, networked computer, or any other computer system configured to execute a program configured to operate or operate in conjunction with the metrology system 200, as described throughout the present disclosure. Further, the steps described throughout the present disclosure may be carried out by a single controller 216 or, alternatively, multiple controllers. Additionally, the controller 216 may include one or more controllers housed in a common housing or within multiple housings. In this way, any controller or combination of controllers may be separately packaged as a module suitable for integration into metrology system 200. Further, the controller 216 may analyze data received from the detector 214 and feed the data to additional components within the metrology system 200 or external to the metrology system 200.

The memory medium 220 may include any storage medium known in the art suitable for storing program instructions executable by the associated one or more processors 218. For example, the memory medium 220 may include a non-transitory memory medium. By way of another example, the memory medium 220 may include, but is not limited to, a read-only memory (ROM), a random-access memory (RAM), a magnetic or optical memory device (e.g., disk), a magnetic tape, a solid-state drive and the like. It is further noted that memory medium 220 may be housed in a common controller housing with the one or more processors 218. In one embodiment, the memory medium 220 may be located remotely with respect to the physical location of the one or more processors 218 and controller 216. For instance, the one or more processors 218 of controller 216 may access a remote memory (e.g., server), accessible through a network (e.g., internet, intranet and the like).

In one embodiment, a user interface (not shown) is communicatively coupled to the controller 216. The user interface may include, but is not limited to, one or more desktops, laptops, tablets, and the like. In another embodiment, the user interface includes a display used to display data of the metrology system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

In another embodiment, the controller 216 is communicatively coupled to one or more elements of the metrology system 200. In this regard, the controller 216 may transmit and/or receive data from any component of the metrology system 200. For example, the controller 216 may be communicatively coupled to the detector 214 to receive one or more images from the detector 214. Further, the controller 216 may direct or otherwise control any component of the metrology system 200 by generating one or more control signals for the associated components.

Figure 4:
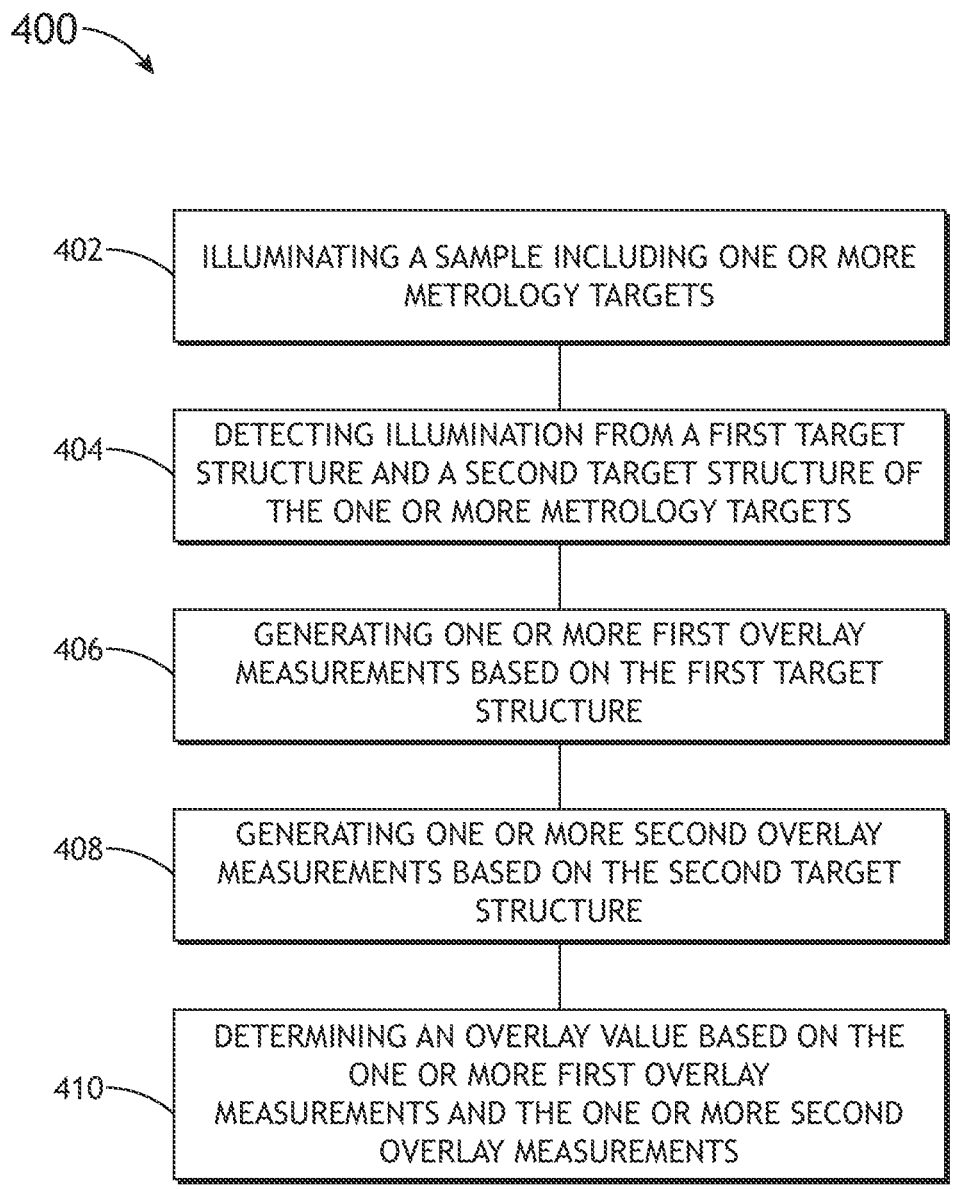
FIG. 4 is a process flow diagram depicting the steps of a method of measuring overlay of a sample, in accordance with one or more embodiments of the present disclosure.

FIG. 4 illustrates a process flow diagram depicting the steps of a method 400 of measuring overlay of a sample, in accordance with one or more embodiments of the present disclosure.

In Step 402, a sample including one or more metrology targets 100 is illuminated. For example, the metrology system 200 may direct an illumination beam onto the sample 202. As used herein, the term "illumination beam" may refer to any radiant beam, including, without limitation, the optical illumination beam 206.

In Step 404, illumination emanating from the first target structure 102 and the second target structure 104 of the metrology target 100 is detected. For example, the optical illumination beam 206 may be detected by the detector 214.

In Step 406, one or more first overlay measurements are generated. For example, the controller 216 may be configured to generate one or more first overlay measurements of the sample 202 based on one or more signals indicative of illumination emanating from one or more portions of the first target structure 102. The one or more first overlay measurements of the sample 202 may include one or more measurements indicative of one or more first layer centers of gravity. For example, the one or more first overlay measurements of the sample 202 may include one or more position measurements between two points on the first layer of the sample 202.

In Step 408, one or more second overlay measurements are generated. For example, the controller 216 may be configured to generate one or more second overlay measurements of the sample 202 based on one or more signals indicative of illumination emanating from one or more portions of the second target structure 104. The one or more second overlay measurements of the sample 202 may include one or more measurements indicative of one or more second layer centers of gravity. For example, the one or more second overlay measurements of the sample 202 may include one or more position measurements between two points on the second layer of the sample 202.

In Step 410, an overlay value is determined based on the one or more first overlay measurements and the one or more second overlay measurements. For example, the overlay value of the sample 202 may include a difference between one or more first layer centers of gravity and one or more second layer centers of gravity. By way of another example, the controller 216 may be configured to compute a difference between the one or more first layer centers of gravity and the one or more second layer centers of gravity.

In some embodiments, the method 400 may include one or more additional steps wherein one or more overlay correctables are provided based on the one or more overlay values determined in at least Step 410. For example, the one or more additional steps may include the controller 216 generating one or more control signals (or corrections to the control signals) for adjusting one or more parameters (e.g., fabrication settings, configuration, and the like) of one or more process tools (e.g., lithographic tools). The control signals (or corrections to the control signals) may be provided by the controller 216 as part of a feedback and/or feedforward control loop. The controller 216 may cause the one or more process tools to execute one or more adjustments to the one or more parameters of the one or more process tools based on the one or more control signals (or corrections to the control signals). In some embodiments, the controller 216 may alert a user to make the one or more adjustments. In this sense, the one or more control signals may compensate for errors of one or more fabrication processes of the one or more process tools, and thus may enable the one or more process tools to maintain overlay within selected tolerances across multiple exposures on subsequent samples in the same or different lots.

Figure 5:
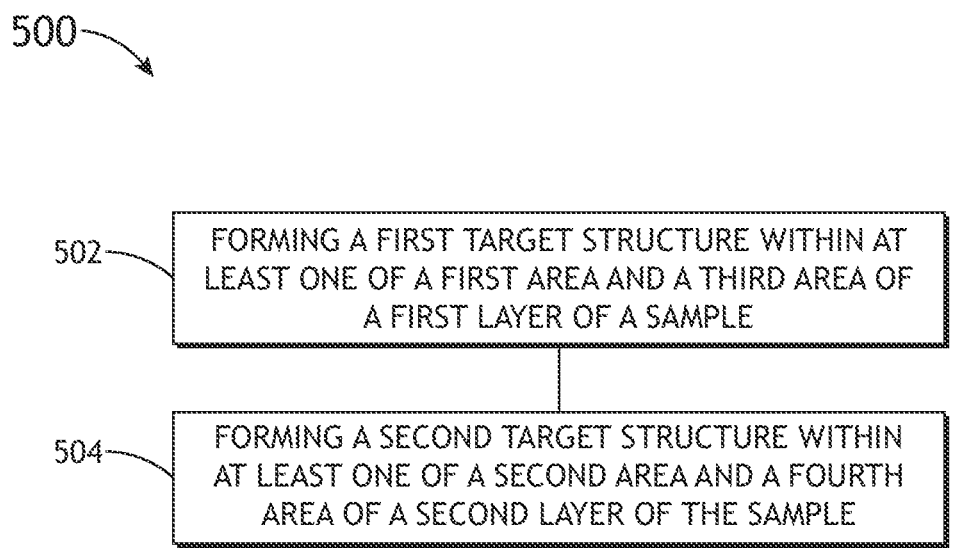
FIG. 5 is a process flow diagram depicting the steps of a method of forming a metrology target, in accordance with one or more embodiments of the present disclosure.

FIG. 5 illustrates a process flow diagram illustrating the steps of a method 500 of forming a metrology target 100, in accordance with one or more embodiments of the present disclosure.

In Step 502, a first target structure 102 is formed within at least one of a first area 120 and a third area 122 of a first layer of a sample 202. For example, the plurality of first cells 106 (including the first cell pattern elements 108) of the first target structure 102 may be fabricated through one or more process steps such as, but not limited to, one or more deposition, lithographic, or etching steps, where the plurality of first cells 106 (including the first cell pattern elements 108) may be formed on the first layer of the metrology target 100. The first target structure 102 may be formed using one or more process tools (e.g., lithographic tools).

In Step 504, a second target structure 104 is formed within at least one of a second area 121 and a fourth area 123 of a second layer of a sample 202. For example, the plurality of second cells 110 (including the second cell pattern elements 112) of the second target structure 104 may be fabricated through one or more process steps such as, but not limited to, one or more deposition, lithographic, or etching steps, where the plurality of second cells 110 (including the second cell pattern elements 112) may be formed on the second layer of the metrology target 100. The second target structure 104 may be formed using one or more process tools (e.g., lithographic tools).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology target comprising:
  a first target structure configured in accordance with a metrology recipe, wherein the first target structure is formed within at least one of a first area and a third area of a first layer of a sample, the first target structure comprising two or more first cells each containing two or more first cell pattern elements arranged periodically; and
  a second target structure configured in accordance with the metrology recipe, wherein the second target structure is formed within at least one of a second area and a fourth area of a second layer of the sample, the second target structure comprising two or more second cells containing two or more second cell pattern elements arranged periodically, wherein the second target structure is formed from a photoresist material with sufficient thickness to induce asymmetry in at least some of the second cell pattern elements when fabricated in accordance with the metrology recipe, wherein at least one of a size or a number the second cell pattern elements is selected in accordance with the metrology recipe to provide that an overlay value for the metrology target mitigates the asymmetry in the at least some of the second cell pattern elements when the overlay value is determined in accordance with the metrology recipe based on one or more images of the metrology target from an optical metrology tool by computing a difference between a center of gravity of the first layer and a center of gravity of the second layer based on averaged individual center of gravity values of each of the first cell pattern elements and the second cell pattern elements.

2. The metrology target of claim 1, wherein the first target structure is two-fold rotationally symmetric to the second target structure about a common center of rotational symmetry on the sample.

3. The metrology target of claim 2, wherein the plurality of first cells comprises one or more first periodically patterned grids, and wherein the one or more first periodically patterned grids include the one or more first cell pattern elements.

4. The metrology target of claim 2, wherein the plurality of second cells comprises one or more second periodically patterned grids, and wherein the one or more second periodically patterned grids include the one or more second cell pattern elements.

5. The metrology target of claim 1, wherein the one or more first cell pattern elements are compatible with an optical metrology mode.

6. The metrology target of claim 1, wherein the one or more second cell pattern elements are compatible with an optical metrology mode.

7. The metrology target of claim 1, wherein the thickness of the photoresist material is greater than 2 micrometers.

8. The metrology target of claim 1, wherein the thickness of the photoresist material is greater than 15 micrometers.

9. A system comprising:
a controller communicatively couplable to one or more metrology sub-systems, wherein the controller including one or more processors, wherein the one or more processors are configured to execute a set of program instructions maintained in memory when implementing a metrology recipe, wherein the set of program instructions is configured to cause the one or more processors to:
receive, from the one or more metrology sub-systems, one or more images indicative of illumination emanating from one or more metrology targets of a sample when implementing the metrology recipe, wherein the one or more metrology targets of the sample comprise:
a first target structure configured in accordance with the metrology recipe, wherein the first target structure is formed within at least one of a first area and a third area of a first layer of a sample, the first target structure comprising two or more first cells containing two or more first cell pattern elements arranged periodically; and
a second target structure configured in accordance with the metrology recipe, wherein the second target structure is formed within at least one of a second area and a fourth area of a second layer of the sample, the second target structure comprising two or more second cells containing two or more second cell pattern elements arranged periodically, wherein the second target structure is formed from a photoresist material with sufficient thickness to induce asymmetry in at least some of the second cell pattern elements when fabricated.
determine a center of gravity for each of the two or more first cells based on averaging individual center of gravity positions of each of the associated first cell pattern elements from the one or more images;
determine a center of gravity of the first layer based on averaging the centers of gravity for the two or more first cells;
determine a center of gravity for each of the two or more second cells based on averaging individual center of gravity positions of each of the associated second cell pattern elements from the one or more images;
determine a center of gravity of the second layer based on averaging the centers of gravity for the two or more second cells;
determine an overlay value of the sample by computing a difference between the center of gravity of the first layer and the center of gravity of the second layer.

10. The system of claim 9, wherein the first target structure is two-fold rotationally symmetric to the second target structure about a common center of rotational symmetry on the sample.

11. The system of claim 10, wherein the plurality of first cells comprises one or more first periodically patterned grids, and wherein the one or more first periodically patterned grids include the one or more first cell pattern elements.

12. The system of claim 10, wherein the plurality of second cells comprises a second plurality of periodically patterned grids, and wherein the second plurality of periodically patterned grids includes the one or more second cell pattern elements.

13. The system of claim 9, wherein the one or more first cell pattern elements are compatible with an optical metrology mode.

14. The system of claim 9, wherein the one or more second cell pattern elements are compatible with an optical metrology mode.

15. A method of measuring overlay of a sample, comprising:
illuminating a sample including one or more metrology targets when implementing a metrology recipe, the one or more metrology targets comprising:
a first target structure configured in accordance with the metrology recipe, wherein the first target structure is formed within at least one of a first area and a third area of a first layer of a sample, the first target structure comprising two or more a plurality of first cells containing two or more first cell pattern elements arranged periodically; and
a second target structure configured in accordance with the metrology recipe, wherein the second target structure is formed within at least one of a second area and a fourth area of a second layer of the sample, the second target structure comprising two or more a plurality of second cells containing two or more second cell pattern elements arranged periodically, wherein the second target structure is formed from a photoresist material with sufficient thickness to induce asymmetry in at least some of the second cell pattern elements when fabricated;
generating one or more images based on illumination emanating from the one or more metrology targets of the sample in accordance with the metrology recipe;
determining a center of gravity for each of the two or more first cells based on averaging individual center of gravity positions of each of the associated first cell pattern elements from the one or more images;
determining a center of gravity of the first layer based on averaging the centers of gravity for the two or more first cells;
determining a center of gravity for each of the two or more second cells based on averaging individual center of gravity positions of each of the associated second cell pattern elements from the one or more images;
determining a center of gravity of the second layer based on averaging the centers of gravity for the two or more second cells; and
determining an overlay value of the sample by computing a difference between the center of gravity of the first layer and the center of gravity of the second layer.

16. The method of claim 15, wherein the first target structure is two-fold rotationally symmetric to the second target structure about a common center of rotational symmetry on the sample.

17. The method claim 16, wherein the plurality of first cells comprises one or more first periodically patterned grids, and wherein the one or more first periodically patterned grids include the one or more first cell pattern elements.

18. The method of claim 16, wherein the plurality of second cells comprises one or more second periodically patterned grids, and wherein the one or more second periodically patterned grids include the one or more second cell pattern elements.

19. The method of claim 15, wherein the one or more first cell pattern elements are compatible with an optical metrology mode.

20. The method of claim 15, wherein the one or more second cell pattern elements are compatible with an optical metrology mode.

21. A method comprising:
  forming a first target structure on a sample in accordance with a metrology recipe, wherein the first target structure is formed within at least one of a first area and a third area of a first layer of a sample, the first target structure comprising two or more first cells containing two or more first cell pattern elements arranged periodically;
  forming a second target structure on the sample from a photoresist material in accordance with the metrology recipe, wherein the second target structure is formed within at least one of a second area and a fourth area of a second layer of the sample, the second target structure comprising two or more second cells containing two one or more second cell pattern elements arranged periodically, wherein the second target structure is formed from a photoresist material with sufficient thickness to induce asymmetry in at least some of the second cell pattern elements when fabricated; and
  receiving one or more images of the first and second target structures from an optical metrology tool;
  determining a center of gravity for each of the two or more first cells based on averaging individual center of gravity positions of each of the associated first cell pattern elements from the one or more images;
  determining a center of gravity of the first layer based on averaging the centers of gravity for the two or more first cells;
  determining a center of gravity for each of the two or more second cells based on averaging individual center of gravity positions of each of the associated second cell pattern elements from the one or more images;
  determining a center of gravity of the second layer based on averaging the centers of gravity for the two or more second cells; and
  determining an overlay value of the sample from the first target structure and the second target structure by computing a difference between the center of gravity of the first layer and the center of gravity of the second layer.

22. The method of claim 21, wherein the first target structure is two-fold rotationally symmetric to the second target structure about a common center of rotational symmetry on the sample.

23. The method of claim 22, wherein the plurality of first cells comprises one or more first periodically patterned grids, and wherein the one or more first periodically patterned grids include the one or more first cell pattern elements.

24. The method of claim 22, wherein the plurality of second cells comprises one or more second periodically patterned grids, and wherein the one or more second periodically patterned grids include the one or more second cell pattern elements.

25. The method of claim 21, wherein the one or more first cell pattern elements are compatible with an optical metrology mode.

26. The method of claim 21, wherein the one or more second cell pattern elements are compatible with an optical metrology mode.

* * * * *